United States Patent

Wood

[11] Patent Number: 5,976,629
[45] Date of Patent: Nov. 2, 1999

[54] COATING COMPOSITIONS

[76] Inventor: Edward Russell Wood, 19 Anderton Way Dimples Ln Garstang, Preston PR3 1RF, United Kingdom

[21] Appl. No.: 09/043,463

[22] PCT Filed: Aug. 30, 1996

[86] PCT No.: PCT/GB96/02096

§ 371 Date: Jun. 3, 1998

§ 102(e) Date: Jun. 3, 1998

[87] PCT Pub. No.: WO97/11134

PCT Pub. Date: Mar. 27, 1997

[51] Int. Cl.$^6$ .......................................... B05D 3/02
[52] U.S. Cl. ............................ 427/385.5; 427/58; 427/96
[58] Field of Search .................................. 427/385.5, 58, 427/96

[56] References Cited

U.S. PATENT DOCUMENTS

| 4,041,086 | 8/1977 | Moore et al. . | |
|---|---|---|---|
| 4,549,686 | 10/1985 | Sargent et al. | 228/242 |
| 4,895,990 | 1/1990 | Sargent et al. | 570/130 |
| 4,929,317 | 5/1990 | Nishimura et al. | 204/59 R |
| 5,026,929 | 6/1991 | Marsella et al. | 570/146 |

FOREIGN PATENT DOCUMENTS

| 1-186828 | 7/1989 | Japan . |
| 6-081424 | 3/1994 | Japan . |
| 9-208935 | 8/1997 | Japan . |
| 10-256240 | 9/1998 | Japan . |
| 2064579 | 6/1981 | United Kingdom . |
| 94-05498 | 3/1994 | WIPO . |

OTHER PUBLICATIONS

Moore et al, ACS Symp. Ser. (1995), 614 (Microelectronics Technology), pp. 449–470, 1995.

*Primary Examiner*—Erma Cameron
*Attorney, Agent, or Firm*—Myers Bigel Sibley & Sajovec, P.A.

[57] ABSTRACT

A composition comprising a perfluorocarbon resin and a fluorocarbon liquid solvent therefor may be applied to an assembly, such as a printed circuit board. The dried composition provides protection for the coated surface from water and other harmful materials.

9 Claims, No Drawings

COATING COMPOSITIONS

This invention relates to coating compositions and in particular coating compositions which are used are to prevent access of potentially problem-causing materials (such as solvents including water) to the surfaces which have been coated.

By way of example, electronics assemblies such as printed circuit boards, especially those intended for use in high-humidity environments, can be affected by the condensation of atmospheric moisture on their surfaces. This moisture may form a thin water-film between areas of opposite polarity and allow "crosstalk" between conductive areas.

In order to reduce this effect, assemblies have, in the past been coated with a variety of resinous materials including acrylics, epoxies, polyurethanes and silicones. These materials also protect the assembly from rough handling in service and from process chemicals. However, apart from when silicone resins are used, the final surface of the coating can still become coated with a film of moisture if the conditions are right.

Some silicone resins can be expensive and are affected by certain common chemicals and also by water under certain circumstances.

In addition, all of the materials mentioned above need to be applied in coatings of substantial thickness, for instance 0.025 mm (0.001 in) to 0.075 mm (0.003 in), in order to be effective. Accordingly, "contact areas" on the board, such as gold-plated edge-fingers (and also some components themselves, e.g. trim-potentiometers and coils) must be prevented from becoming coated with resin. This is normally a very tedious, time-consuming, labour-intensive and therefore costly process, which needs to be repeated as any "masking materials" applied to the assemblies also need to be removed.

Furthermore, some of the resins mentioned above need to be heat-cured. This requires equipment and is also energy-consumptive. The applied heat may also damage the assembly which has been coated by the resin. Even the shrinkage of the resin during cure can affect delicate components.

Finally, some of the solvents used to dissolve and "thin" the resins may be flammable, toxic and/or may chemically affect the assemblies or may be "ozone-depleting".

Some of the above-mentioned disadvantages have been overcome in the past by the use of very low solids-content solutions of fluoro-acrylate resin polymers in perfluorocarbon liquids (such as "FLUORAD" FC-722 marketed by the 3M Company). Unfortunately, when dry, these resins tend to crack when flexed. They are also quite expensive.

Fluoroacrylate-polymer resins are also chemically attacked by a number of common chemical agents such as isopropanol, dilute acetic acid and some other common solvents. They also have limited solubilities in perfluorocarbon liquids so that around 6–8% by weight is the maximum concentration that can be achieved in this type of solvent.

SUMMARY OF INVENTION

According to the present invention there is provided a method of protecting an assembly, or part thereof, comprising applying a composition to said assembly, or part thereof, and drying, or allowing to dry, the applied composition to leave a thin coating of a resin on said assembly, or part thereof, characterised in that the applied composition comprises a multicyclic perfluorinated cycloalkane resin and a fluorocarbon liquid solvent therefor.

The coating provided by the method of the present invention provides an improved material, compared with the prior art coatings discussed above. It is not only resistant to "attack" by solvents, including water and common organic solvents, it is also more resistant to chemical attack. Furthermore, such a coating is inherently flexible and will not crack when flexed at low temperatures.

Preferably, the resin has the formula $C_nF_m$ where n is from 25 to 60 and $n<m<2n+2$. The molecular weight of such a material lies between 1200 and 2400.

The perfluorinated cycloalkane may be made by fluorination of a cycloalkane by fluorine gas and $CoF_3$ catalyst. A preferred cycloalkane is phenanthrene.

The solvent may be any suitable fluorocarbon liquid, examples being a hydrofluorocarbon, a perfluorocarbon, a hydrochlorofluorocarbon and a chlorofluorocarbon.

Preferably the solvent is a perfluorocarbon and more preferably a perfluorinated alkane or cycloalkane, for instance, perfluorinated n-hexane or perfluoro-dimethyl cyclohexane.

Preferably the solvent has a boiling point in the range 30°–200° C., more preferably in the range 55°–130° C. Selecting a solvent with a lower boiling point in the broad range, will reduce the "drying time" of the coating.

A coating made by the method of the invention can be applied by any of the commonly-used methods, ie.

dipping spraying brushing flood-coating curtain-coating pull-down bars hypodermic 'spotting'

For electronics assemblies such as fully-assembled circuit-boards, dipping is preferred. Dipping should be carried out in correctly-designed equipment, that is to say equipment having the means for:

total immersion, vertically, of large, perhaps multiple, assemblies complete recovery of evaporated PFC solvent by e.g. chilled condenser coils or plates possible rotation/twisting/inversion of assemblies to allow air-escape possible automatic control of, e.g., concentration as a coating run proceeds.

Drying with correctly-designed coating equipment, and using low boiling-point solvents, normally takes place inside the coating equipment, by solvent flash-off. Coated parts normally, therefore, emerge touch-dry and ready for use. For particularly aggressive service environments such as:

gambling equipment in bars (ethyl alcohol)

check-out tills in supermarkets (alcohol, acetic acid, bleach, sauces)

under-bonnet electronics (glycols, oils, salt-spray, alcohols, petrol) air-dried coated assemblies should be baked at 40–55° C. for up to 5 minutes.

Where higher concentration solutions are used (ie >8%), force-drying times up to 15 mins might be contemplated.

Typically, the concentration of resin in the composition is between 0.4% and 20% by weight, more preferably between 0.4% and 8% by weight. Coating articles with these solutions by, for instance, dipping, gives thicknesses around $3–8\times10^{-5}$ ins (0.7–2 micrometers). Further details of fluoropolymer resins of use in the present invention may be found in the specification of PCT Application No. WO 94/05498 which is concerned with the plasticizing of fluoropolymer resins with high-boiling fluorinated aliphatic cyclic structures in order to improve the melt processing characteristics, and other properties, of the polymers.

The perfluorocarbon resin of use in the present invention is typically one or more oligomers, an example being represented by the formula:

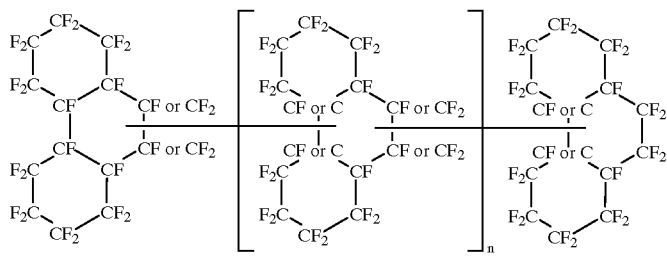

where n is 0, 1 or 2.

A coating formed from the composition of the present invention has a very low surface-energy since the coating material consists of only carbon and fluorine atoms with the result that any condensed atmospheric moisture cannot form a contiguous film on its surface. Such a coating has a negligible resistance to abrasion and therefore "masking", as previously described, is not necessary. Where perfluorohexane is used as a solvent, the coating will dry in less than 15 seconds even on cold days and does not require heating to achieve this. It has a low glass-transition temperature, and is thus flexible at room temperature and just below and will not crack when flexed.

Reference has been made above to coatings applied to electronics assemblies such as printed circuit boards. Other applications (for which different concentrations of polymer in the composition may be appropriate) include:

1. As a liquid "mask" to prevent other types of coating material accessing areas of electronics devices and components not requiring coating.
2. As a non-stick coating to prevent adhesion between inherently "sticky" materials and other areas, for example, overspill/overspray of adhesives, to allow easy removal.
3. A coating for the inside of ink cartridges to maximise removal of the contents in use.
4. As anti-graffiti coatings.
5. For coating high-voltage insulator "sheds" against water films formed during rain/snow.
6. To prevent fluxes accessing areas of metal not required to be joined during soldering processes.
7. For corrosion-protection of metal items.
8. To prevent ingress of moisture into stonework, brickwork, against ice-splitting of brick-face.
9. To prevent ingress of moisture into automobile electronics, spark-plugs and as a "damp-start" spray.
10. To protect outdoor/sea-going electronics assemblies (e.g. burglar alarms, traffic-light controls, sea-going navigational equipment) from water/salt-spray.
11. As the basis of anti-fouling paint for boats.
12. To prevent smoke-alarms becoming contaminated by films of condensed cooking fat and, greases.
13. To preserve books and manuscripts.

EXAMPLE

A solution of a fluoropolymer resin, prepared in accordance with details given in PCT Patent Application No. WO 94/05498 (and documents referred to therein), was prepared by dissolving sufficient of it, at room temperature in perfluorohexane ("FLUTEC" PP-1 from BNFL Fluorochemicals Ltd) to make a 2% w/w solution. Typical physical properties of this solution are given in Table 1.

TABLE 1

| Property | Value |
| --- | --- |
| 1. Appearance | Water-white to yellow clear solution (concentration-dependent) |
| 2. S.G | 1.7 to 2.1 (concentration-dependent) |
| 3. Surface Energy (dry solid) | 18–19 mNm$^{-1}$ |
| 4. Solvent Boiling Point | 56° C. |
| 5. Surface Tension (solvent) | 11 mNm$^{-1}$ |
| 6. Vapour Pressure (solvent) | 294 mbar |
| 7. Water Solubility | |
| SOLID | Insoluble |
| SOLVENT | Insoluble |
| 8. Freezing Point (solvent) | −90° C. |
| 9. Flash Point | None |
| 10. Flexibility (BS 3900:E11) | No cracking or detachment |
| 11. TABER Abrasion Resistance (ASTM D4060) 8μ thick film (250 gr. load. CS10 wheels) | 40% wear after 150 cycles |
| 12. Contact Angle - distilled water | 110° |

The transmitter board of a "radio burglar alarm" was removed and dipped into the solution for 3 seconds, withdrawn and allowed to dry, the drying time being approximately 10 seconds. The coated board was then placed in the mainstream of cold water from a tap, shaken hard and replaced in the alarm. When powered-up it functioned normally.

The resistance of the resin to a range of common chemicals was measured according to British Standard BS3900, G5, Method No3. The results of these tests are given in Table 2.

TABLE 2

| CHEMICAL USED | RESULT |
| --- | --- |
| Hexane | No damage |
| MIBK | No damage |
| Butyl Acetate | No damage |
| Dichloromethane | No damage |
| MEK | No damage |
| Propan-2-ol | No damage |
| Mineral Oil | No damage |
| Hydraulic Oil | No damage |
| 10% acetic acid | No damage |

TABLE 2-continued

| CHEMICAL USED | RESULT |
| --- | --- |
| 10% NaOH | No damage |
| 10% HCl | No damage |

The electrical properties of the resin were assessed using accelerated SIR testing in a controlled environment. Test coupons were thoroughly cleaned using an ICOM 8000 ionic extraction cleaner to a surface contamination of less than 0.25 $\mu$g NaCl $cm^{-2}$.

After coating in various concentration solutions of the new material, the coupons were ramped to 85° C. and 85% RH (slowly, to avoid condensation).

The AUTO-SIR was programmed to apply a 50V bias for 60 hours, and a measurement of current flow taken every 6 minutes throughout the test period. The results are given in Table 3.

TABLE 3

| Weight/Weight Concentration | Max (PEAK) LOG Current | Minimum Resistance Across Comb Pattern (ohms) |
| --- | --- | --- |
| No coating | −7.95 | $4.5 \times 10^9$ |
| 2% | −8.10 | $6.3 \times 10^9$ |
| 5% | −7.78 | $3.02 \times 10^9$ |
| 15% | −9.57 | $3.72 \times 10^9$ |

Microscopic inspection of the test coupons revealed that no dendrites had formed during the test.

The test coupon comb-pattern used had a 250$\mu$ gap between 2 rows of 20 comb legs. The fact that moisture reaches the coupon surface is not problematic so long as the moisture insulation of the coating is high enough.

The IVF in Sweden published a report (no. 93803) in which fifteen leading traditional coatings were subjected to SIR/humidity testing using an identical comb-pattern to that used in our tests. The coating in accordance with the present invention performs to the same or to a higher standard than 13 out of the 15 traditional coatings used in their tests.

Despite the excellent solvent resistance summarised in Table 2, the coating material remains totally soluble in its original solvent. For 100% coating removal, vapour-condensation (identical to vapour-degreasing in operation) with the same solvent can be used.

I claim:

1. A method of protecting an assembly, or part thereof, comprising applying a composition to said assembly, or part thereof, and drying, or allowing to dry, the applied composition to leave a coating of a resin on said assembly, or part thereof, characterised in that the applied composition comprises a multicyclic perfluorinated cycloalkane resin and a fluorocarbon liquid solvent therefor.

2. A method according to claim 1 and wherein the perfluorinated cycloalkane is made by fluorination of a cycloalkane by fluorine gas and $CoF_3$ catalyst.

3. A method according to claim 1 or claim 2 and wherein the cycloalkane is phenanthrene.

4. A method according to any of the preceding claims and wherein the fluorocarbon liquid solvent is a perfluorocarbon.

5. A method according to claim 1 wherein the solvent is a perfluorinated alkane or cycloalkane.

6. A method according to claim 5 and wherein the solvent is perfluorinated n-hexane or perfluoro-dimethyl cyclohexane.

7. A method according to claim 1 wherein the solvent has a boiling point in the range 30°–120° C.

8. A method according to claim 7 and wherein the solvent has a boiling point in the range 55°–130° C.

9. A method according to claim 1 wherein the concentration of resin is between 0.4% and 20% by weight.

* * * * *